(12) United States Patent
Sato et al.

(10) Patent No.: US 8,440,266 B2
(45) Date of Patent: May 14, 2013

(54) DEVELOPING DEVICE, DEVELOPING METHOD AND STORAGE MEDIUM

(75) Inventors: Norikatsu Sato, Koshi (JP); Hirofumi Takeguchi, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 578 days.

(21) Appl. No.: 12/699,228

(22) Filed: Feb. 3, 2010

(65) Prior Publication Data

US 2010/0203250 A1    Aug. 12, 2010

(30) Foreign Application Priority Data

Feb. 6, 2009  (JP) ................................ 2009-026186

(51) Int. Cl.
*B05D 1/36* (2006.01)
*B05D 7/00* (2006.01)
*B05D 3/12* (2006.01)
*B05C 11/00* (2006.01)
*B05C 11/02* (2006.01)
*B05B 7/06* (2006.01)

(52) U.S. Cl.
USPC ........... 427/402; 427/240; 118/696; 118/313; 118/52

(58) Field of Classification Search ... 427/402; 118/313, 118/696
See application file for complete search history.

(56) References Cited

U.S. PATENT DOCUMENTS

| | | | | |
|---|---|---|---|---|
| 6,634,806 B2* | 10/2003 | Toshima et al. | ................ | 396/611 |
| 6,817,790 B2* | 11/2004 | Toshima et al. | ................ | 396/604 |
| 7,665,916 B2* | 2/2010 | Yamamoto et al. | ........... | 396/611 |
| 2003/0198468 A1* | 10/2003 | Park et al. | ...................... | 396/564 |
| 2004/0115567 A1* | 6/2004 | Mandal et al. | ................. | 430/324 |
| 2006/0040051 A1* | 2/2006 | Yamamoto et al. | ........... | 427/240 |
| 2007/0116459 A1* | 5/2007 | Takeguchi et al. | ............ | 396/604 |
| 2007/0122551 A1* | 5/2007 | Yamamoto et al. | ........... | 427/240 |
| 2009/0033898 A1* | 2/2009 | Yamamoto et al. | ............. | 355/53 |
| 2009/0130614 A1* | 5/2009 | Ookouchi et al. | ............. | 430/434 |
| 2011/0096304 A1* | 4/2011 | Takeguchi et al. | .............. | 355/27 |

FOREIGN PATENT DOCUMENTS

| | | |
|---|---|---|
| JP | 61-123136 | 6/1986 |
| JP | 10-156262 | 6/1998 |
| JP | 2001-284206 A1 | 10/2001 |
| JP | 2001284206 A * | 10/2001 |
| JP | 2004-319990 | 11/2004 |
| JP | 2005-210059 A1 | 8/2005 |

OTHER PUBLICATIONS

JP2001284206 English translation.*

* cited by examiner

*Primary Examiner* — Dah-Wei Yuan
*Assistant Examiner* — Diane Zhang
(74) *Attorney, Agent, or Firm* — Burr & Brown

(57) ABSTRACT

A developer nozzle supplies a developer onto the surface of a substrate rotating around a vertical axis, while a pure water nozzle supplies pure water onto the surface of the rotating substrate. The pure water nozzle is spaced apart from the developer nozzle and located on an outer side of the substrate with respect to the developer nozzle. The pure water restricts flow of the developer on the substrate and causes the developer to spread toward a clockwise side of the substrate when the substrate rotates in a clockwise direction. A liquid film containing the developer and the pure water is formed on the substrate. The developer nozzle and the pure water nozzle are spaced apart from each other to suppress splattering of the developer and the pure water due to collision of the developer with the pure water.

4 Claims, 8 Drawing Sheets

DEVELOPING DEVICE, DEVELOPING METHOD AND STORAGE MEDIUM

FIELD OF THE INVENTION

The present application claims priority from Japanese application JP2009-026186, filed on Feb. 6, 2009, the content of which is hereby incorporated by reference into this application.

BACKGROUND OF THE INVENTION

1. Field of the Invention

The present invention relates to a developing device and a developing method, which supply a developer onto a substrate prepared by forming a resist film thereon and then being subjected to an exposure process, and to a storage medium that is used for the developing method.

2. Description of the Related Art

A process for manufacturing a semiconductor device involves a photolithography process. In such a photolithography process, a resist film is formed on a substrate such as a semiconductor wafer (hereinafter merely referred to as a wafer), and then exposed and developed to form a circuit pattern in the film. A system including a coating/developing device and an exposure device (connected to the coating/developing device) is used for the photolithography process. The coating/developing device is used to perform a coating process and a development process on the resist film. The exposure device is used to expose the resist film. One type of conventional developing devices performs a development process as follows: a substrate holder that holds a horizontally-oriented wafer rotates around a vertical axis; a developer nozzle supplies a developer onto the surface of the wafer from the upper side of the wafer; the developer nozzle moves in the radial direction of the wafer (while supplying the developer onto the surface of the substrate) to form a liquid film containing the developer on the surface of the wafer.

In order that the developing device performs the development process uniformly on the surface of the wafer, it is necessary that the liquid film containing the developer be uniformly formed on the surface of the wafer or it is necessary that the developer and the wafer uniformly contact each other. Thus, a process for improving wettability of the surface of the wafer with respect to the developer is performed before the development process, or the developer (that dissolved a resist film) used for the wafer is rapidly removed, as described in JP-A-2005-210059 and JP-A-2001-284206.

When the developer is supplied onto the surface of the wafer, the developer may splatter on the surface of the wafer and be attached to the developer nozzle. In this case, the developer attached to the developer nozzle may be dry on the surface of the developer nozzle, and a solid component contained in the developer may be dropped onto the surface of the wafer and then form a particle. Thus, various methods of supplying a developer onto the surface of a wafer have been discussed in order to suppress splattering of a developer on the surface of the wafer.

The surface of a wafer (resist film) has recently become more hydrophobic (water-repellent). One of the reasons is as follows. An immersion exposure process, which is performed in the following way, has been discussed. In the immersion exposure process, a liquid such as pure water is provided between a light source for exposure (such as an irradiator (lens) that irradiates the surface of the wafer with light (e.g., argon fluoride laser light)) and the surface of a wafer (resist film). Laser light emitted by the light source has a small wavelength. The surface of the wafer is exposed to the laser light. Thus, the immersion exposure process is performed so that the pure water does not have an adverse impact on a process (heating process or development process) that is performed after the exposure process. In other words, the immersion exposure process is performed so that the pure water does not remain on the wafer after the immersion exposure process. Specifically, a highly hydrophobic resist film is used so that the surface of the wafer has high hydrophobicity in some cases. Alternatively, a hydrophobic film is formed on the surface of the resist film in some cases. In those cases, a contact angle of the pure water on the surface of the wafer may be increased to approximately 90 degrees.

In the process of developing the hydrophobic surface of the wafer, the developer may splatter due to a surface tension of the water on the surface of the wafer. As a result, the wafer and the developer may not uniformly contact with each other. It is difficult to develop such a hydrophobic wafer by means of the techniques described in JP-A-2005-210059 and JP-A-2001-284206. In addition, the developer may easily splatter on the surface of the highly hydrophobic wafer. Furthermore, when the developer and a rinse liquid are simultaneously dropped onto the surface of the wafer from the developer nozzle and a rinse nozzle in order to develop the wafer as described in JP-A-2005-210059 and JP-A-2001-284206, the developer and the rinse liquid may easily collide with each other and splatter on the surface of the wafer.

SUMMARY OF THE INVENTION

The present invention has been devised to address the aforementioned problem. The invention provides a developing device and a developing method, which perform a development process by supplying a developer onto a substrate prepared by forming a resist film thereon and then being subjected to an exposure process. Even when the surface of the substrate has high hydrophobicity, splattering of the developer on the surface of the substrate is suppressed in the developing device and the developing method. The developer is capable of uniformly contacting the substrate. The invention also provides a storage medium storing data for the developing method.

According to a first aspect of the present invention, a developing device that performs a development process by supplying a developer onto a substrate being prepared by forming a resist film thereon and then being subjected to an exposure process includes: a substrate holder that holds the substrate so that the substrate is horizontally oriented; a rotary mechanism that rotates the substrate around a vertical axis through the substrate holder; a first nozzle that has a first supply port, the first nozzle supplying the developer through the first supply port onto the substrate placed on the substrate holder; a second nozzle that has a second supply port, the second nozzle is spaced apart from the first nozzle and located on an outer side of the substrate with respect to the first nozzle when the first nozzle is located above a central portion of the substrate placed on the substrate holder, wherein the second nozzle supplies a liquid through the second supply port onto the substrate so that the liquid restricts flow of the developer on the substrate; a nozzle holding mechanism that holds the first and second nozzles so that a distance between the first and second supply ports is in a range of 13 mm to 33 mm, the nozzle holding mechanism moves the first and second nozzles between the central portion of the substrate and an outer edge of the substrate; and a controller that controls the first and second nozzles to cause the first nozzle to supply the developer onto the central portion of the substrate and cause the second nozzle to supply the flow-restriction liquid onto the substrate to perform a pre-wet process on the substrate under the condition that the substrate rotates around the vertical axis, and then controls the first nozzle to cause the first nozzle to supply the developer onto the substrate to perform a development process on the substrate after the pre-wet process under the condition that the substrate rotates.

According to a second aspect of the present invention, a developing method for performing a development process by supplying a developer onto a substrate being prepared by forming a resist film thereon and then being subjected to an exposure process includes the steps of: holding the substrate on a substrate holder so that the substrate is horizontally oriented; holding a first nozzle and a second nozzle so that a distance between a first supply port included in the first nozzle and a second supply port included in the second nozzle is in a range of 13 mm to 33 mm, wherein the first nozzle is adapted to supply the developer onto the substrate and the second nozzle is adapted to supply onto the substrate a liquid to restrict flow of the developer on the substrate, and that the second nozzle is spaced apart from the first nozzle and located on an outer side of the substrate with respect to the first nozzle when the first nozzle is located above a central portion of the substrate placed on the substrate holder; performing a pre-wet process so that the first nozzle supplies the developer onto the central portion of the substrate and the second nozzle supplies the flow-restriction liquid onto the substrate under the condition that the substrate rotates around a vertical axis; and performing a development process so that the first nozzle supplies the developer onto the substrate under the condition that the substrate rotates around the vertical axis.

According to a third aspect of the present invention, a storage medium stores a computer program that runs on a computer and is used for a developing method for performing a development process by supplying a developer onto a substrate being prepared by forming a resist film thereon and then being subjected to an exposure process, the method including the steps of: holding the substrate on a substrate holder so that the substrate is horizontally oriented; holding a first nozzle and a second nozzle so that a distance between a first supply port included in the first nozzle and a second supply port included in the second nozzle is in a range of 13 mm to 33 mm, wherein the first nozzle is adapted to supply the developer onto the substrate and the second nozzle is adapted to supply onto the substrate a liquid to restrict flow of the developer on the substrate, and that the second nozzle is spaced apart from the first nozzle and located on an outer side of the substrate with respect to the first nozzle when the first nozzle is located above a central portion of the substrate placed on the substrate holder; performing a pre-wet process so that the first nozzle supplies the developer onto the central portion of the substrate and the second nozzle supplies the flow-restriction liquid onto the substrate under the condition that the substrate rotates around a vertical axis; and performing a development process so that the first nozzle supplies the developer onto the substrate under the condition that the substrate rotates around the vertical axis.

According to each of the aspects of the present invention, the development process is performed by holding the substrate being prepared by forming a resist film thereon and then being subjected to an exposure process, and rotating the substrate around the vertical axis, and supplying the developer onto the surface of the substrate. The first nozzle supplies the developer onto the surface of the substrate rotating around the vertical axis, while the second nozzle supplies the flow-restriction liquid onto the surface of the substrate to restrict flow of the developer on the substrate. The flow-restriction liquid supplied from the second nozzle causes the developer to spread toward a clockwise side of the substrate when the substrate rotates in a clockwise direction (or the flow-restriction liquid supplied from the second nozzle causes the developer to spread toward a counterclockwise side of the substrate when the substrate rotates in a counterclockwise direction). A liquid film containing the developer and the pure water is formed on the substrate. The second nozzle is located on the outer side of the substrate with respect to the first nozzle and spaced apart from the first nozzle to suppress splattering of the developer and the pure water on the substrate due to collision of the developer with the pure water. Even when the substrate has high hydrophobicity, the developer supplied onto the substrate is capable of uniformly contacting the surface of the substrate. An occurrence of a particle due to the developer supplied from the first nozzle can be suppressed.

DETAILED DESCRIPTION OF THE INVENTION

A developing device according to an embodiment of the present invention is described with reference to FIGS. 1 to 3B.

Figure 1:
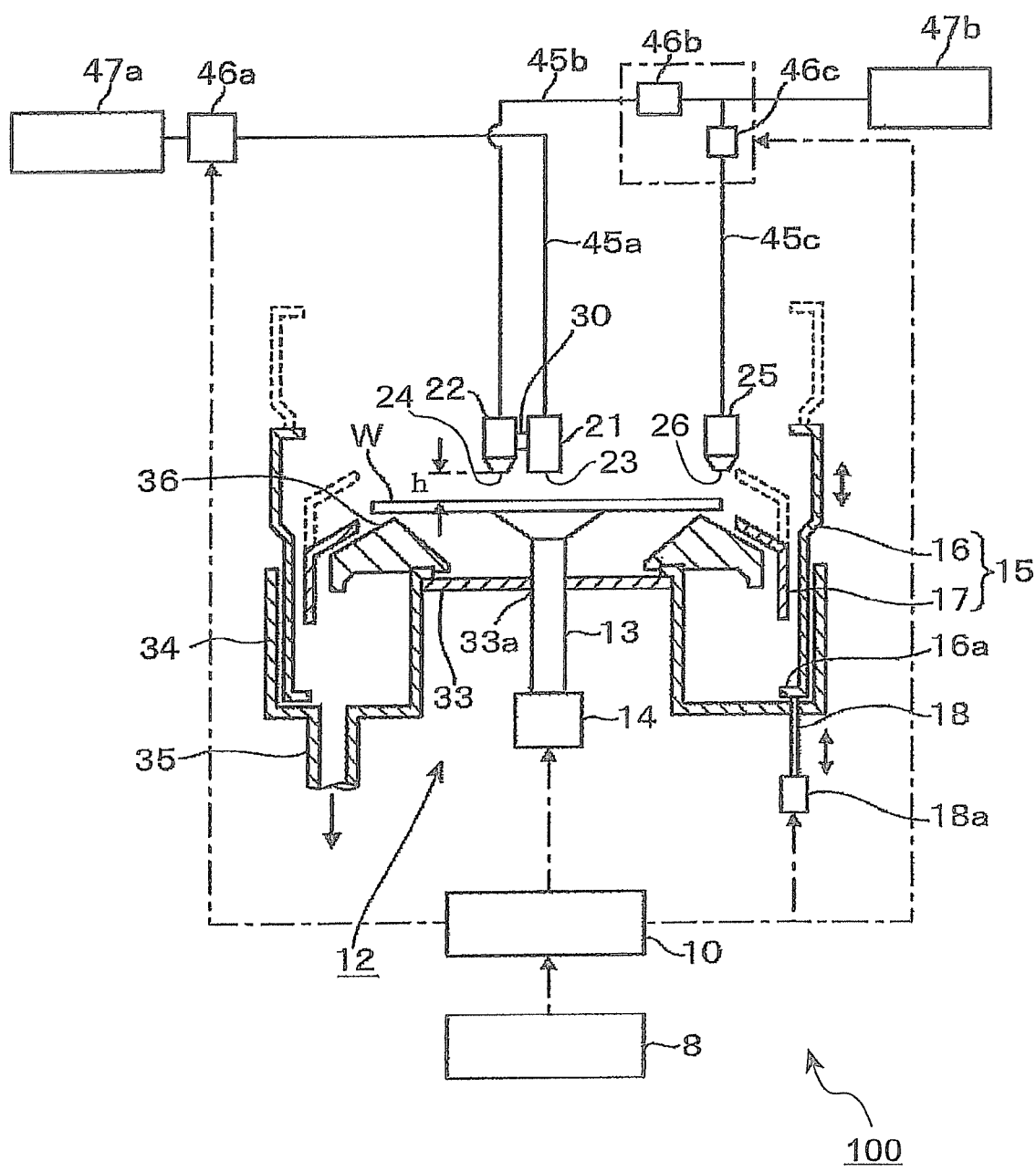
FIG. 1 is a vertical cross sectional view of an example of a developing device according to the present invention.
Figure 2:
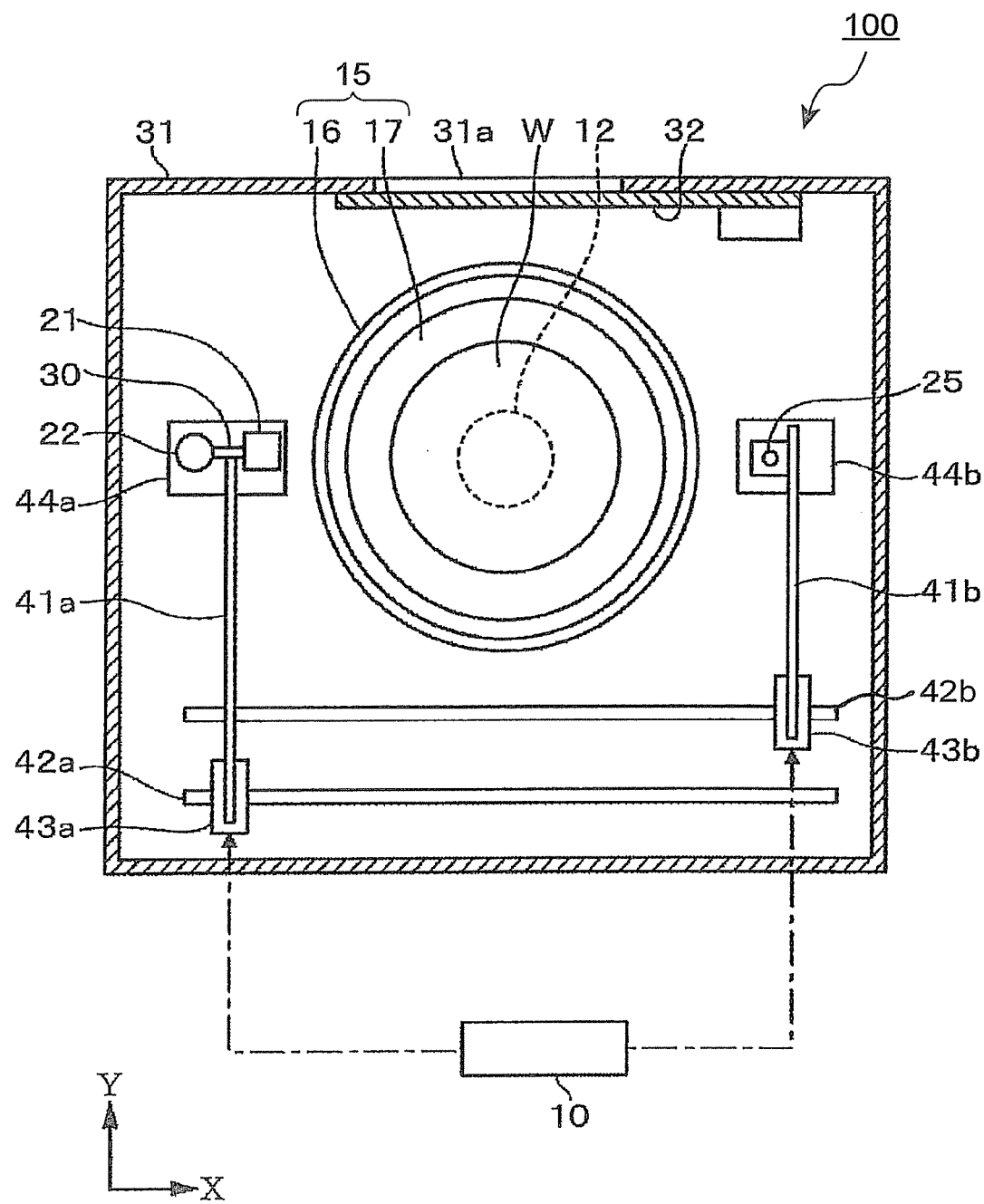
FIG. 2 is a horizontal cross sectional view of the developing device.

In FIGS. 1 and 2, reference numeral 100 denotes the developing device. The developing device 100 includes a spin chuck 12, a developer nozzle 21 and a pure water nozzle 22. The spin chuck 12 serves as a substrate holder. The spin chuck 12 sucks a semiconductor wafer (hereinafter merely referred to as a wafer) W from a back surface of the wafer W to hold the wafer W so that the wafer W is horizontally oriented. The developer nozzle 21 serves as a first nozzle and supplies a developer onto a front surface of the wafer W. The pure water nozzle 22 is connected to the developer nozzle 21 through a holding member 30. The pure water nozzle 22 serves as a second nozzle and supplies a flow-restriction liquid (for restricting flow of the developer) such as pure water onto the front surface of the wafer W.

The spin chuck 12, the developer nozzle 21 and the pure water nozzle 22 are included in a housing 31 as shown in FIG. 2. The housing 31 has a transfer port 31a in its side surface. The wafer W can be transferred through the transfer port 31a. In FIG. 2, reference numeral 32 denotes a shutter that opens and closes the transfer port 31a.

A central portion of a lower surface of the spin chuck 12 is connected to an end of a rotary shaft 13. The other end of the rotary shaft 13 is connected to a drive section 14 that serves as a rotary mechanism. The drive section 14 holds the spin chuck 12 so that the spin chuck 12 is capable of rotating around a vertical axis.

The spin chuck 12 includes a support pin (e.g., three support pins) that moves up and down the wafer W from the back surface of the wafer W via a through-hole. The wafer W held by the spin chuck 12 is capable of being moved to an upper position and a lower position by means of the support pin. When the wafer W is located at the upper position, the wafer W can be transferred from the developing device 100 to a transfer unit (main transfer unit 65 described later). In addition, the wafer W can be transferred from the transfer unit to the developing device 100 so that the wafer W is located at the upper position. The transfer unit is located outside the developing device 100. A development process (described later) is performed on the wafer W when the wafer W is located at the lower position.

A cup body 15 is provided outside the spin chuck 12 as shown in FIG. 1. The cup body 15 surrounds a side surface of the wafer W and has openings at its upper and lower ends. The cup body 15 has a substantially cylindrical shape. The cup body 15 includes an outer cup 16 and an inner cup 17. The outer cup 16 has a substantially cylindrical shape. The inner cup 17 has a substantially cylindrical shape and is arranged on an inner side of the outer cup 16.

The outer cup 16 has an engagement portion 16a at its bottom end. The engagement portion 16a extends from an inner wall of the outer cup 16 toward the inner side of the cup body 15 in a circumferential direction of the outer cup 16. The inner cup 17 has an upper portion and a lower portion. The lower portion of the inner cup 17 extends downward and is capable of being engaged with the engagement portion 16a. The upper portion of the inner cup 17 is bent toward the inner side of the cup body 15 and close to an outer end of the wafer W.

The outer cup 16 has a lower surface connected to an end of a lifting shaft 18. The lifting shaft 18 moves up and down the outer cup 16. The outer cup 16 is moved up by the lifting shaft 18, and the engagement portion 16a is then engaged with the inner cup 17. After that, the outer cup 16 and the inner cup 17 are moved up and down by the lifting shaft 18. In FIG. 1, reference numeral 18a denotes a lifting mechanism that is connected to the other end of the lifting shaft 18.

A circular plate 33 is provided under the wafer W placed on the spin chuck 12. The circular plate 33 has a through-hole 33a at its center. The rotary shaft 13 extends through the through-hole 33a and is capable of rotating around a vertical axis.

A liquid receiver 34 is provided on an outer side of the circular plate 33. The liquid receiver 34 collects a liquid such as the developer discharged from an outer edge of the wafer W (placed on the spin chuck 12) and discharges the collected liquid. The liquid receiver 34 has a substantially ring shape. The liquid receiver 34 has an opening at its upper side. A lower portion of the cup body 15 is located in the liquid receiver 34.

The liquid (such as the developer) blown off or dropped from the outer edge of the wafer W is received by the inner wall of the cup body 15 and dropped along the inner wall of the cup body 15. After that, the liquid is discharged through a drainage path 35 to a drainage unit (not shown). The drainage path 35 is connected to a lower surface of the liquid receiver 34. The drainage unit is provided outside the developing device 100. In FIG. 1, reference numeral 36 denotes a ring member. The ring member 36 is provided between the circular plate 33 and the wafer W and has a substantially pyramidal shape in its vertical cross section.

The developer nozzle 21 and the pure water nozzle 22 are located above the spin chuck 12 and face the wafer W. The developer nozzle 21 serves as the first nozzle and supplies the developer onto the front surface of the wafer W. The pure water nozzle 22 serves as the second nozzle and supplies the flow-restriction liquid such as pure water onto the front surface of the wafer W. A side surface of the developer nozzle 21 and a side surface of the pure water nozzle 22 are connected to each other by means of the holding member 30 so that the developer nozzle 21 and the pure water nozzle 22 are capable of moving in horizontal and vertical directions in an integrated manner. The holding member 30 serves as a nozzle holding mechanism. The holding member 30 has a plate-like shape, for example. The nozzles 21 and 22 are held by the holding member 30 so that the pure water nozzle 22 is located on an outer side of the wafer W with respect to the developer nozzle 21 and spaced apart from the developer nozzle 21 when the nozzles 21 and 22 are viewed from the wafer W located on the spin chuck 12.

Figure 3A:
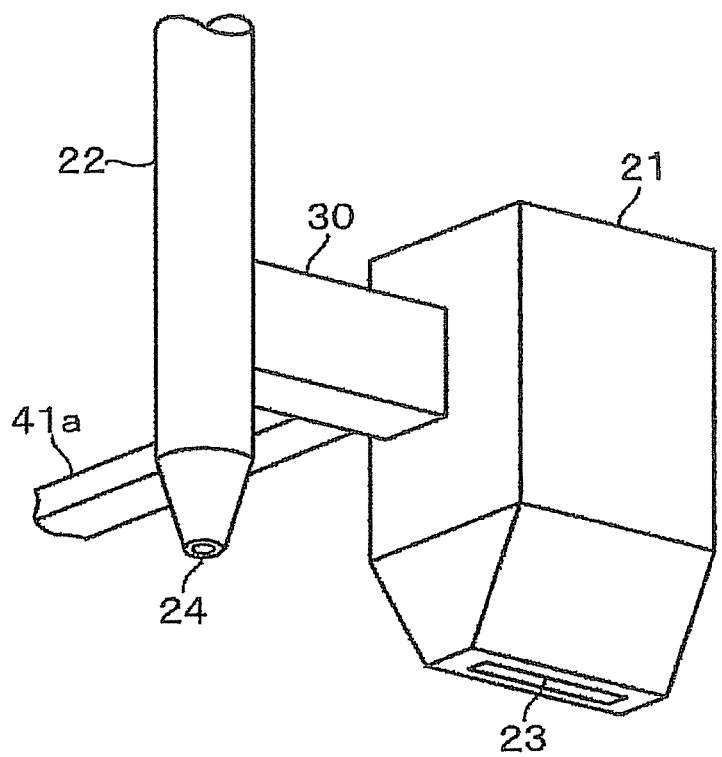
FIGS. 3A and 3B are outline diagrams each showing an example of a nozzle included in the developing device.

Referring to FIG. 3A, the developer nozzle 21 has a first supply port 23 in its lower surface. The developer nozzle 21 supplies the developer onto the wafer W through the first supply port 23. The pure water nozzle 22 has a second supply port 24 in its lower surface. The pure water nozzle 22 supplies the pure water onto the wafer W through the second supply port 24.

Figure 3B:
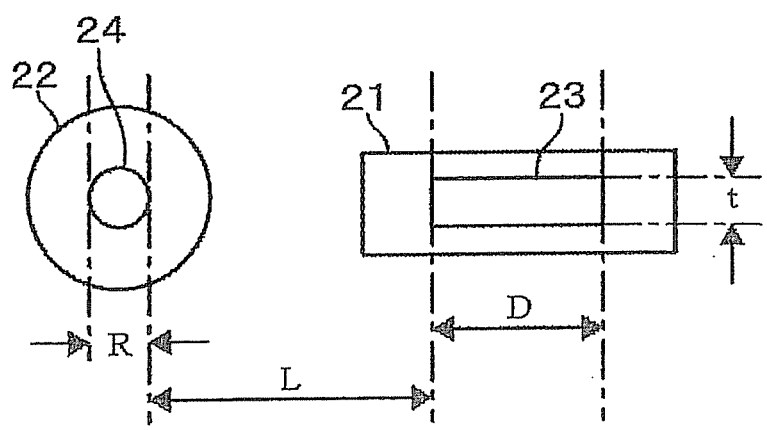

Referring to FIG. 3B, a distance L between the first supply port 23 and the second supply port 24 is in a range of 13 mm to 33 mm, preferably set to 13 mm. When the distance L is too large, the pure water may not cause the developer to sufficiently spread toward the outer side of the wafer W. When the distance L is too small, the developer may collide with the pure water and splatter from the wafer W.

The first supply port 23 has a rectangular opening as shown in FIG. 3B. The length D of the longer side of the first supply port 23 is 10 mm, while the length t of the shorter side of the first supply port 23 is 2 mm, for example. The developer nozzle 21 is capable of supplying the developer onto the wafer W along the radial direction of the wafer W. The direction of the longer side of the first supply port 23 is substantially parallel to the radial direction of the wafer W.

The second supply port 24 has a circular opening. The circular opening has a diameter R of 3 mm, for example. The nozzles 21 and 22 are held by the holding member 30 so that the vertical position of the first supply port 23 and the vertical position of the second supply port 24 are the same or slightly different from each other.

As shown in FIGS. 2 and 3A, a side surface of the holding member 30 located between the nozzles 21 and 22 is joined to an end of a first nozzle arm 41a that horizontally extends. The other end of the first nozzle arm 41a is joined to a movement stage 43a. The joint of the arm 41a and the movement stage 43 is separated from the spin chuck 12.

The movement stage 43a is capable of moving along a guide member 42a that horizontally extends in a direction (X direction shown in FIG. 2) perpendicular to the longitudinal direction of the first nozzle arm 41a. The nozzles 21 and 22 are capable of being moved up and down by a lifting mechanism (not shown).

As shown in FIG. 1, a distance h between the first and second supply ports 23, 24 and the front surface of the wafer W is set to, for example, 10 mm before the developer and the pure water are supplied onto the wafer W.

In FIG. 2, reference numeral 44a denotes a standby section located side by side with the spin chuck 12. The nozzles 21 and 22 wait on or above the standby section 44a, while end portions of the nozzles 21 and 22 are cleaned by the standby section 44a, for example.

The developer nozzle 21 is connected to an end of a developer supply pipe 45a. The developer is supplied through the developer supply pipe 45a to the developer nozzle 21. The other end of the developer supply pipe 45a is connected to a developer storage section 47a through a flow controller 46a. The flow controller 46a controls the amount of the developer and stops the supply of the developer. The developer storage section 47a stores the developer. The pure water nozzle 22 is connected to an end of a pure water supply pipe 45b. The pure water is supplied through the pure water supply pipe 45b to the pure water nozzle 22. The other end of the pure water supply pipe 45b is connected to a pure water storage section 47b through a flow controller 46b. The flow controller 46b controls the amount of the pure water and stops the supply of the pure water. The pure water storage section 47b stores the pure water.

A rinse nozzle 25 faces the wafer W located on the spin chuck 12. The rinse nozzle 25 supplies a rinse liquid (pure water) onto the front surface of the wafer W. The rinse nozzle 25 is connected to a movement stage 43b through a second nozzle arm 41b that horizontally extends. The movement stage 43b is capable of moving along a guide member 42b that horizontally extends in the direction (X direction shown in FIG. 2) perpendicular to the longitudinal direction of the second nozzle arm 41b.

The rinse nozzle 25 is connected to the pure water storage section 47b and supplies the rinse liquid (pure water) onto the wafer W through a supply port 26. The supply port 26 is formed in a lower surface of the rinse nozzle 25. A rinse liquid supply pipe 45c is provided between the rinse nozzle 25 and the pure water storage section 47b. The rinse liquid supply pipe 45c is connected to a flow controller 46c. The flow controller 46c controls the amount of the rinse liquid and stops the supply of the rinse liquid. In FIG. 2, reference numeral 44b denotes a standby section for the rinse nozzle 25. An end portion of the rinse nozzle 25 is cleaned by the standby section 44b, for example.

The developing device 100 has a controller 10 as shown in FIGS. 1 and 2. The controller 10 is connected to the drive section 14, the movement stages 43a, 43b and the flow controllers 46a to 46c. The controller 10 controls the drive section 14, the movement stages 43a, 43b and the flow controllers 46a to 46c.

The controller 10 includes a computer program, a memory and a CPU. The controller 10 outputs control signals to the parts included in the developing device 100. The computer program includes steps that cause the developing device 100 to perform a pre-wet process (described later) and the development process in accordance with the output control signals. The computer program causes the developing device 100 to perform the pre-wet process and the development process after the computer program controls the following: rotational speed of the spin chuck 12; a rotation program for the spin chuck 12; the start position of the nozzle 21 for supplying the developer; the start position of the nozzle 22 for supplying the pure water; the amount of the developer that is to be supplied from the nozzle 21; the amount of the pure water that is to be supplied from the nozzle 22; and the like. Therefore, a liquid film 55 (described later) can be uniformly formed on the surface of the wafer W and splattering of the developer and the pure water can be suppressed on the surface of the wafer W.

The computer program is stored in a storage medium 8. The storage medium 8 may be a hard disk, a compact disc, a magnet optical disc, a memory card or the like. The computer program is installed into the controller 10 from the storage medium 8.

Operations of the developing device 100 are described below with reference to FIGS. 4A to 6B.

First, the wafer W that is to be subjected to the development process is described. A resist film is formed on the front surface of the wafer W. After that, an exposure process is performed on the wafer W. The exposure process is an immersion exposure process. In the immersion exposure process, a liquid such as pure water is provided between a lens included in a light source for exposure and the surface of the wafer W. Thus, the resist film may contain a hydrophobic (water-repellent) compound to prevent the pure water from remaining on the wafer W after the immersion exposure process. Alternatively, a hydrophobic film, through which laser light can be transmitted, may be formed on the resist film. A contact angle of the pure water on the surface of the wafer W is in a range of 70 degrees to 110 degrees. In the above case, the contact angle is approximately 90 degrees.

Next, the development process that is performed on the wafer W is described. First, the cup body 15 moves down to its lower position. Then, the nozzle arms 41a and 41b move so that the nozzles 21, 22 wait on or above the standby section 44a and the nozzle 25 waits on or above the standby section 44b.

Then, the transfer unit (main transfer unit 65 described later) transfers the wafer W into the housing 31 of the developing device 100 through the transfer port 31a. The transfer unit and a lifting pin (not shown) place the wafer W on the spin chuck 12 so that the spin chuck 12 sucks and holds the wafer W.

Then, the developer nozzle 21 is positioned so that the center of the nozzle 21 is located directly above the center of the wafer W. After that, the first nozzle arm 41a moves and is positioned so that the distance h between the first and second supply ports 23, 24 and the front surface of the wafer W is 10 mm. The spin chuck 12 then rotates around the vertical axis (e.g., in a clockwise fashion) at rotational speed of 100 rpm to 2500 rpm, for example, 1500 rpm. In this case, the cup body 15 is lifted up to its upper position.

Figure 4A:
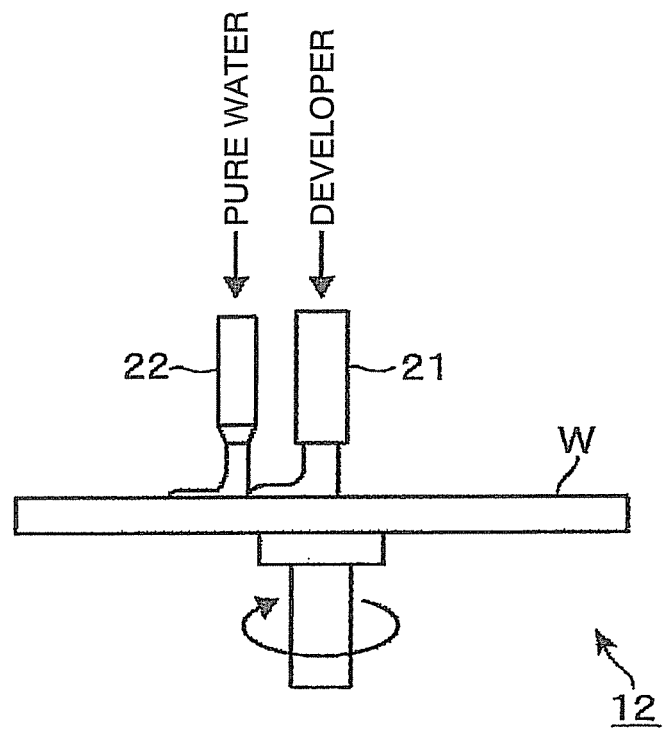
FIGS. 4A and 4B are schematic diagrams of the developing device to show an operation of the developing device.

Referring to FIG. 4A, the developer nozzle 21 supplies the developer onto the surface of the wafer W at a predetermined flow rate, for example 300 ml/min, while the pure water nozzle 22 supplies the pure water onto the surface of the wafer W at a predetermined flow rate, for example 1000 ml/min.

The developer and the pure water are supplied onto the surface of the wafer W under the condition that the distance (shown by reference numeral 50 in FIG. 5A) between the first and second supply ports 23 and 24 is in a range of 13 mm to 33 mm. In this example, the distance 50 is set to 13 mm. The developer and the pure water spread toward the outer side of the wafer W due to a centrifugal force.

Figure 5A:
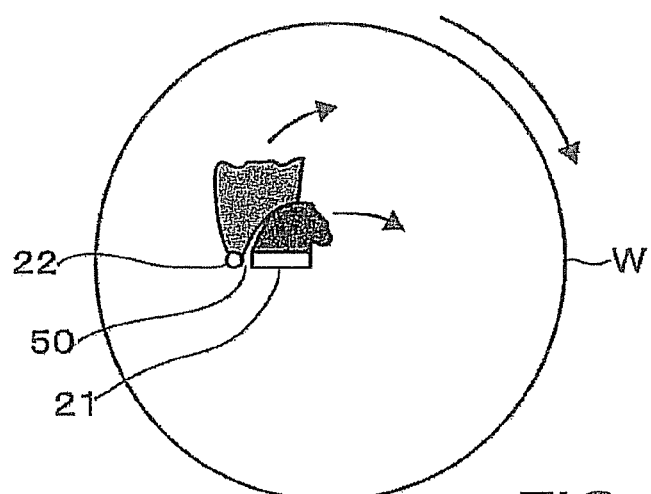
FIGS. 5A to 5C are schematic diagrams of the developing device to show an operation of the developing device.
Figure 5B:
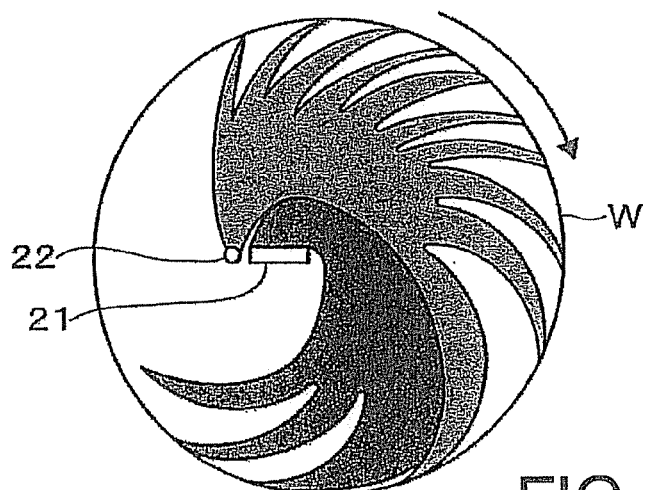

As the developer and the pure water spread toward the outer side of the wafer W, the developer and the pure water more widely spread on the wafer W. The developer and the pure water contact (collide) with each other at a location distant from the positions at which the developer and the pure water are supplied onto the wafer W. The distance L between the first supply port 23 and the second supply port 24 (or the distance between the location from which the developer is supplied and the location from which the pure water is supplied) is large. Thus, even when the developer and the pure water contact with each other, the developing device 100 suppresses severe collision of the developer with the pure water. The developer and the pure water therefore do not splatter on the wafer W or slightly splatter on the wafer W. As a result, the developer and the pure water that are supplied onto the wafer W do not splatter to the nozzles 21 and 22 and are not attached to the nozzles 21 and 22. FIG. 5A schematically shows the case where the developer and the pure water contact (collide) with each other.

The thickness of the developer supplied onto the wafer W is smaller toward the outer side of the wafer W. The surface of the wafer W is water-repellent. Thus, each of the developer and the pure water flows toward the outer side of the wafer W and is branched into fine portions in a radial fashion due to a surface tension of the developer and a surface tension of the pure water. In this case, the pure water flows on a counterclockwise side of the wafer W with respect to the developer when the wafer W rotates in a clockwise direction (or the pure water flows on a clockwise side of the wafer W with respect to the developer when the wafer W rotates in a counterclockwise direction). The flow of the developer toward the counterclockwise side of the wafer W is restricted by the pure water when the wafer W rotates in the clockwise direction (or the flow of the developer toward the clockwise side of the wafer W is restricted by the pure water when the wafer W rotates in the counterclockwise direction). Thus, a portion of the developer, which is located around the boundary between the developer and the pure water, has a large thickness. Therefore, the developer is pushed toward the clockwise side of the wafer W when the wafer W rotates in the clockwise direction (or the developer is pushed toward the counterclockwise side of the wafer W when the wafer W rotates in the counterclockwise direction).

Figure 4B:
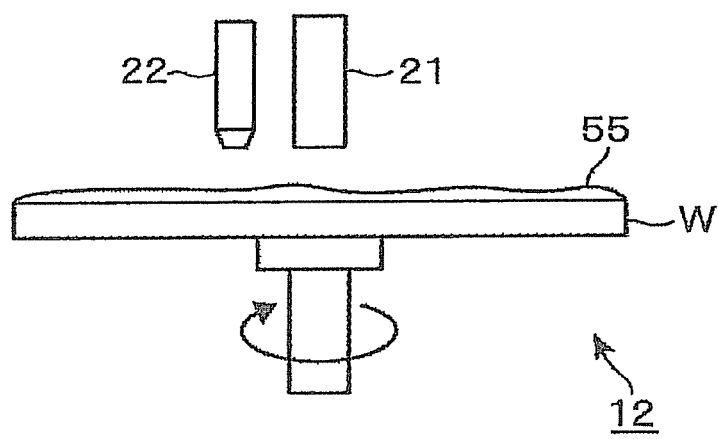
Figure 5C:
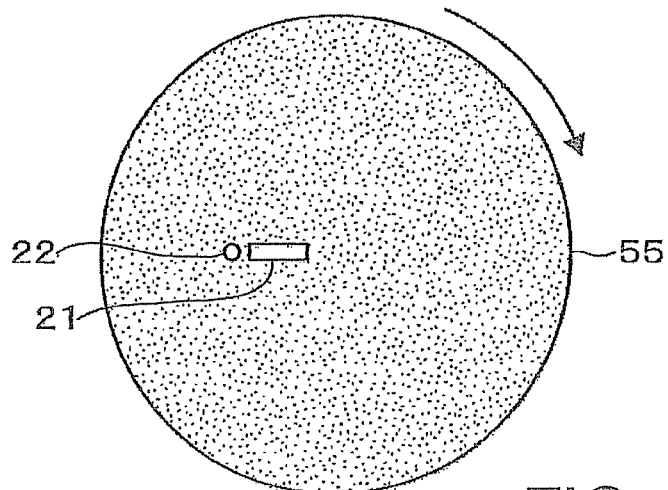

As described above, the amount of the pure water (that is to be supplied) is larger than the amount of the developer (that is to be supplied). Thus, the developer is pushed toward the clockwise side of the wafer W when the wafer W rotates in the clockwise direction (or the developer is pushed toward the counterclockwise side of the wafer W when the wafer W rotates in the counterclockwise direction). When the rotation of the wafer W, and the supply of the developer and the supply of the pure water continue, the developer spread on the wafer W against surface tensions (causing the developer to be branched into fine portions) and toward the clockwise side of the wafer W when the wafer W rotates in the clockwise direction (or toward the counterclockwise side of the wafer W when the wafer W rotates in the counterclockwise direction). Therefore, the liquid film 55 containing the developer and the pure water is formed on the surface of the wafer W as shown in FIGS. 4B and 5C. In this way, the pre-wet process is performed.

After that, the pure water nozzle 22 stops supplying the pure water. Alternatively, the pure water nozzle 22 stops supplying the pure water, and the developer nozzle 21 then stops supplying the developer. Then, the developer nozzle 21 moves and is positioned directly above an end portion of the wafer W under the condition that the wafer W rotates.

Figure 6A:
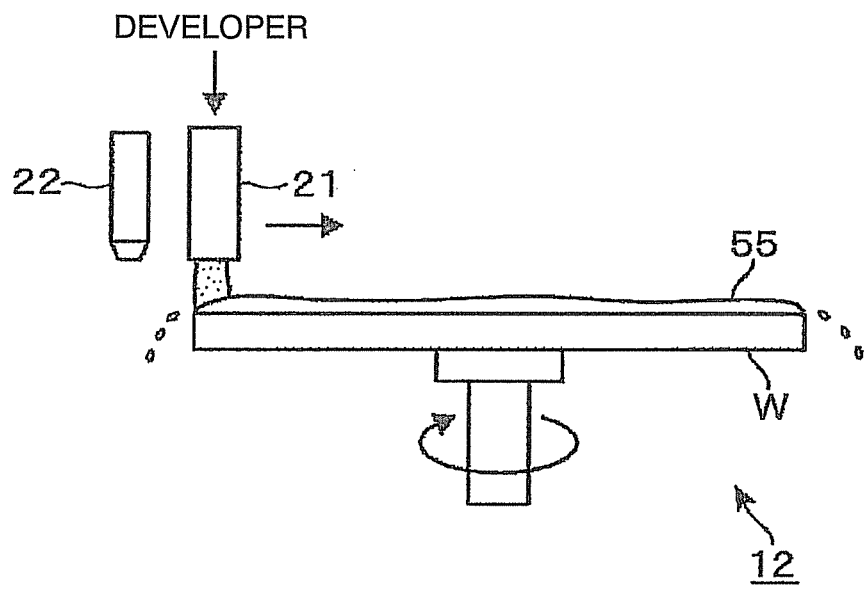
FIGS. 6A and 6B are schematic diagrams of the developing device to show an operation of the developing device.

As shown in FIG. 6A, the wafer W rotates at predetermined rotational speed, while the developer nozzle 21 supplies the developer onto the wafer W at a predetermined flow rate. The developer nozzle 21 then moves toward the center of the wafer W at predetermined speed. In this case, since the surface of the wafer W is sufficiently wet due to the liquid film 55, the surface tension of the pure water on the wafer W is reduced. Thus, the hydrophobicity of the wafer W is reduced (and the contact angle of the pure water is reduced).

Figure 6B:
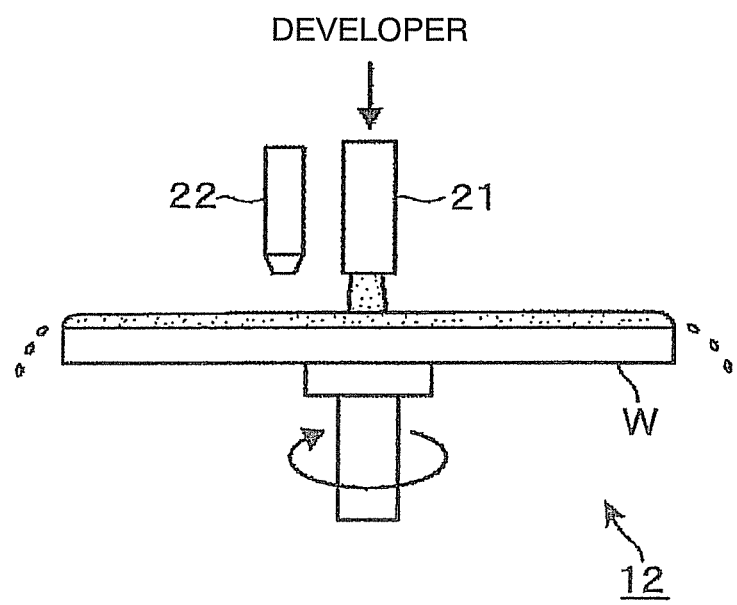

Even when the developer is supplied onto the surface of the wafer W, the developer does not splatter. While the wafer W is wet, the developer and the pure water are mixed with each other to form a mixed liquid containing the developer and the pure water due to the supply of the developer, as shown in FIG. 6B. The mixed liquid pushed by the developer is blown off the outer edge of the wafer W. In this case, since the liquid film 55 is formed on the surface of the wafer W, the liquid film 55 serves as a collision-absorbing material to suppress upward splattering when the developer nozzle 21 supplies the developer onto the wafer W.

A component of the resist film is dissolved and mixed with the developer. A circuit pattern made of an undissolved component of the resist film is formed on the surface of the wafer W. Then, the development process is performed on the thus structured wafer W. In the pre-wet process, the developer is supplied onto the surface of the wafer W as described above. In the development process, since the density of the developer is low, the degree of the dissolution reaction of the resist film is small, or the dissolution reaction does not have an impact on the development process.

After that, the cup body 15 moves downward so that the nozzles 21 and 22 are retracted from positions located above the wafer W. In addition, the rinse nozzle 25 is positioned above the wafer W, and the cup body 15 then moves upward. Then, the wafer W rotates, and the rinse nozzle 25 supplies the rinse liquid (such as pure water) onto the wafer W to blow the developer and the dissolved component of the resist film off the outer edge of the wafer W. Then, the development process is terminated. After that, the wafer W rotates at high rotational speed to be dry. Then, the wafer W is transferred from the developing device 100 to the outside of the device 100 in order to perform a subsequent process.

In the embodiment, the developer nozzle 21 supplies the developer onto the surface of the wafer W rotating around its vertical axis, while the pure water nozzle 22 (located on the outer side of the wafer W with respect to the developer nozzle 21 and spaced apart from the developer nozzle 21) supplies the pure water onto the surface of the wafer W rotating around its vertical axis. In this case, the flow of the developer on the wafer W is restricted by the pure water. The pure water pushes the developer and causes the developer to spread toward the clockwise side of the wafer W when the wafer W rotates in the clockwise direction. The liquid film 55 containing the developer and the pure water is formed on the wafer W. The developer nozzle 21 and the pure water nozzle 22 are spaced apart from each other to suppress collision of the developer with the pure water and thereby suppress splattering of the developer and the pure water.

Thus, the splattering of the developer on the wafer W is suppressed. Then, the pure water nozzle 22 stops supplying the pure water. Also, the developer nozzle 21 supplies the developer. Even when the surface of the wafer W has high hydrophobicity, the developer uniformly contacts the surface of the wafer W. This structure of the developing device can suppress an occurrence of particles due to the developer supplied from the developer nozzle 21.

In the pre-wet process, the nozzles 21 and 22 stop above the wafer W and supply the developer and the pure water. The nozzles 21 and 22 may move from the side of a central portion of the wafer W to the outer edge of the wafer W or from the outer edge of the wafer W to the side of the central portion of the wafer W, while the nozzles 21 and 22 supply the developer and the pure water.

The developer used in the pre-wet process may be pure water, while the flow-restriction liquid used in the pre-wet process may be a developer. Specifically, the pure water may be supplied from the first nozzle 21 (located on the central side of the wafer W), and the developer may be supplied from the second nozzle 22 (located on the outer side of the wafer W). Alternatively, both the nozzles 21 and 22 may supply the developer or a mixed liquid containing the developer and the pure water. In those cases, the amount of the developer, the amount of the flow-restriction liquid, and the shapes and dimensions of the supply ports of the nozzles are appropriately set. Since the developer is expensive, it is preferable that the first nozzle 21 supply the developer and the second nozzle 22 supply the pure water to suppress the amount of the developer that is to be used, as described in the embodiment. A surfactant solution may be replaced with the pure water.

An extensible member such as a spring may be the holding member 30 and adjust the distance L between the nozzles 21 and 22. In this case, the distance L can be adjusted on the basis of the following recipes: the contact angle of the pure water on the surface of the wafer W; (the type of the resist film; the type of the hydrophobic film formed on the resist film); the type of the developer; and the like. The distance L may be manually adjusted on the basis of the recipes by a worker. Also, the distance L may be automatically adjusted by an instruction of the controller 10 on the basis of the recipes read from the memory included in the controller 10. When the contact angle is equal to or smaller than 90 degrees, the ratio of the amount of the developer to the amount of the pure water may be adjusted under the condition that the distance L is fixed. Alternatively, the distance L may be adjusted to a range of 13 mm to 20 mm without adjustment of the amount of the developer and the amount of the pure water. When the contact angle is equal to or larger than 90 degrees, the distance L may be adjusted to a range of 20 mm to 33 mm. The amount of the developer and the amount of the pure water may be increased on the basis of the distance L that can be adjusted.

The nozzles 21 and 22, which are spaced apart from each other with the distance L, may be connected to respective nozzle arms without the holding member 30. In this case, the nozzle arms serve as the holding member.

Figure 7:
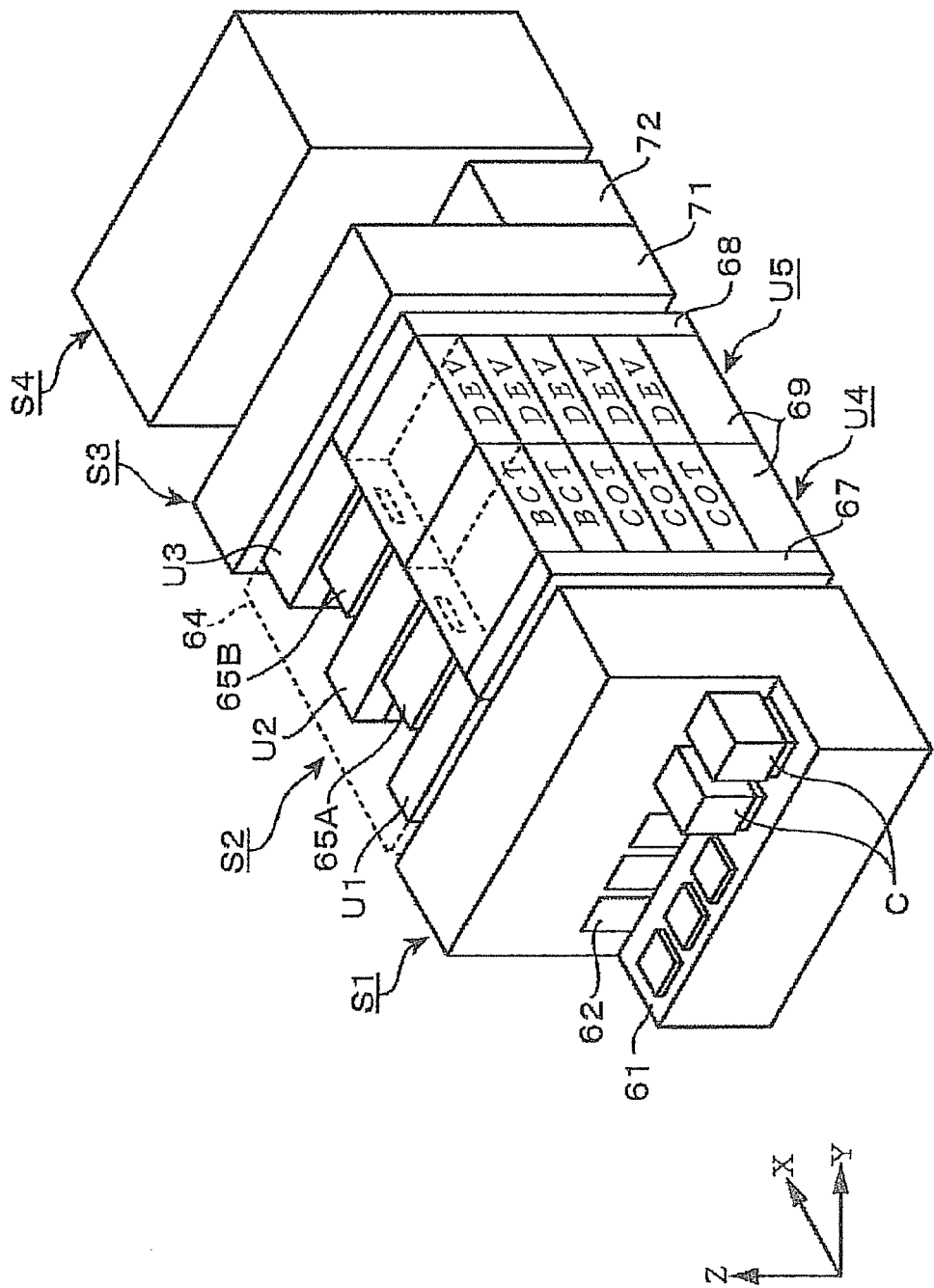
FIG. 7 is a perspective view of an example of a coating/developing apparatus including the developing device.
Figure 8:
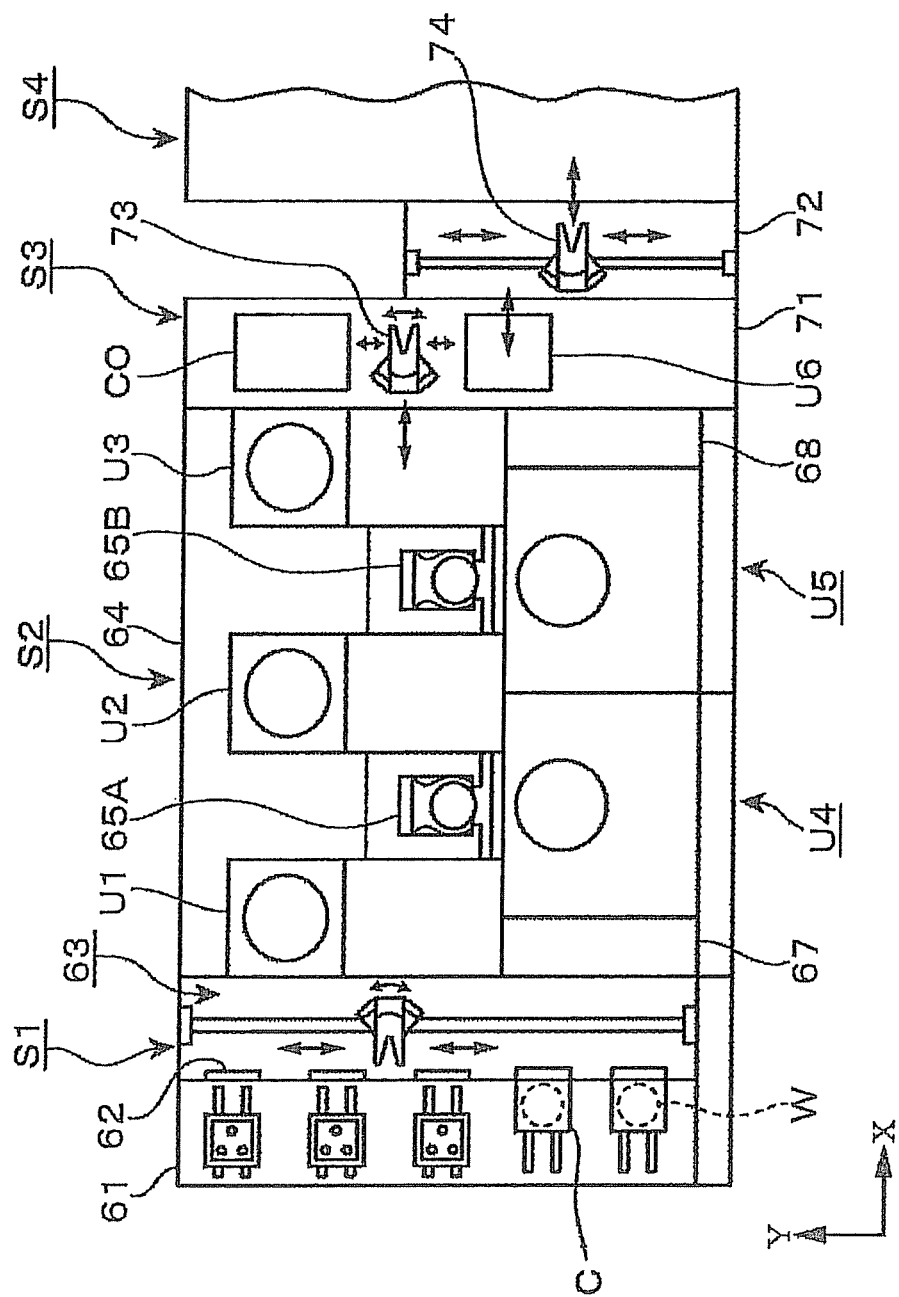
FIG. 8 is a plan view of the coating/developing apparatus.

Next, a coating/developing apparatus having the developing device 100 is described below with reference to FIGS. 7 and 8. The coating/developing apparatus has a cassette unit S1 and a process unit S2. The cassette unit S1 includes a stage 61, an opening/closing section 62 and a transfer section 63. The cassette unit S1 transfers wafers W (e.g., 25 wafers W) contained in a carrier C into or out of the process unit S2. A plurality of carriers C can be placed on the stage 61. The opening/closing section 62 is provided in a wall surface of the cassette unit S1. The wall surface is located on the side of the process unit S2 with respect to the stage 61. The transfer section 63 transfers the wafers W between the carrier C and the process unit S2 through the opening/closing section 62.

The cassette unit S1 is connected to the process unit S2 that is surrounded by a housing 64. The process unit S2 includes shelf units U1, U2 and U3, liquid process units U4 and U5, and main transfer units 65A and 65B. Each of the shelf units U1 to U3 includes a heating unit and a cooling unit. The heating and cooling units included in each shelf unit are arranged in a multilayer structure. The main transfer units 65A and 65b allow each wafer W to be transferred among the units U1 to U5. Specifically, the shelf unit U1, the main transfer unit 65A, the shelf unit U2, the main transfer unit 65B and the shelf unit U3 are arranged in a row in this order from the side of the cassette unit S1. The units U1 to U3, 65A and 65B are arranged in an X direction shown in FIGS. 7 and 8. A transfer port is provided between the unit U1 and the unit 65A. A transfer port is provided between the unit 65A and the unit U2. A transfer port is provided between the unit U2 and the unit 65B. A transfer port is provided between the unit 65B and the unit U3. Thus, each wafer W is capable of moving between the shelf unit U1 and the shelf unit U3. The liquid process units U4 and U5 are arranged on the right side of the process unit S2 when viewed from the side of the unit S1. The main transfer unit 65A is located in a space surrounded by the following surfaces: a surface of the shelf unit U1; a surface of the shelf unit U2; a surface of the liquid process unit U4; and a surface of the housing 64. The main transfer unit 65B is located in a space surrounded by the following surfaces: a surface of the shelf unit U2; a surface of the shelf unit U3; a surface of the liquid process unit U5; and the surface of the housing 64.

A temperature/humidity adjustment unit 67 is provided on the side of the cassette unit S1 with respect to the liquid process unit U4. A temperature/humidity adjustment unit 68 is provided on the side of an exposure unit S4 (described later) with respect to the liquid process unit U5. Each of the liquid process units U4 and U5 includes a storage section 69 that used for supplying liquid such as coating liquid (resist liquid) and developer. Each of the liquid process units U4 and U5 includes a bottom reflection preventive film coating unit BCT, a coating unit COT, and a development unit DEV, for example. Each of the liquid process units U4 and U5 has five units, for example. The bottom reflection preventive film coating unit BCT performs a coating process so that a reflection preventive film is coated on each wafer W. The coating unit COT performs a coating process so that a coating film (resist film) is coated on each wafer W. The developing unit DEV is the aforementioned developing device 100. Each of the shelf units U1 to U3 includes various units (e.g., ten units laminated) that perform processes before and after processes performed by the liquid process units U4 and U5. The heating unit (described above) included in each shelf unit heats (bakes) each wafer W. The cooling unit (described above) included in each shelf unit cools each wafer W.

The exposure unit S4 is connected to the shelf unit U3 through an interface unit S3. The interface unit S3 includes a first transfer chamber 71 and a second transfer chamber 72. The inside of the exposure unit S4 is not illustrated. The exposure unit S4 is an immersion exposure unit. Specifically, the exposure unit S4 exposes the surface (resist film) of each wafer W to laser light emitted by a light source (such as an irradiator (lens) that irradiates the surface of the wafer W with laser light (e.g., argon fluoride laser light)) for exposure under the condition that a liquid (e.g., pure water) is provided between the surface of the wafer W and the light source. In this case, the laser light emitted by the light source has a small wavelength.

The interface unit S3 includes two transfer sections 73, 74, a shelf unit U6 and a buffer cassette CO. The transfer sections 73 and 74 transfer each wafer W between the process unit S2 and the exposure unit S4.

The following describes an example of the transfer of the wafer in the coating/developing apparatus. First, the carrier C containing a wafer W is placed on the stage 61. Then, the opening/closing section 62 is open and a lid of the carrier C is removed. The wafer W is taken out of the carrier C by the transfer section 63. The wafer W is then transferred to the main transfer unit 65A through a transfer unit (not shown) that forms a single stage included in the shelf unit U1. A bottom reflection preventive film is then formed on the wafer W by the bottom reflection preventive film coating unit BCT included in the liquid process unit U4, for example. The main transfer unit 65A transfers the wafer W to the shelf units U1 and U2 so that the wafer W is prebaked by the heating units included in the shelf units U1 and U2 and then cooled by the cooling units included in the shelf units U1 and U2. After that, a coating film is formed on the wafer W by the coating unit COT for formation of a hydrophobic resist film (e.g., non-topcoat resist film). The wafer W is then prebaked and cooled in the same way as described above. The resist film is then formed on the wafer W. After that, the wafer W is transferred to the exposure unit S4 through the interface unit S3. The exposure unit S4 performs an immersion exposure process so that the wafer W (resist film) is then exposed to laser light (e.g., argon fluoride laser light) emitted by the light source (for exposure) under the condition that a mask (reticle) having a predetermined circuit pattern thereon and the liquid (e.g., pure water) are provided between the lens and the surface of the wafer W. After that, the wafer W is transferred to the development unit DEV (included in the liquid process unit U5) from the exposure unit S4 in the opposite order to the transfer of the wafer to the exposure unit S4. The development unit DEV then performs the aforementioned development process on the wafer W. The wafer W subjected to the development process is then returned to the carrier C, for example.

What is claimed is:

1. A developing method for performing a development process by supplying a developer onto a substrate, the substrate being prepared by forming a resist film thereon and then being subjected to an exposure process, comprising the steps of:
    holding the substrate on a substrate holder so that the substrate is horizontally oriented;
    holding a first nozzle and a second nozzle so that a distance between a first supply port included in the first nozzle and a second supply port included in the second nozzle is in a range of 13 mm to 33 mm, wherein the first nozzle is adapted to supply the developer onto the substrate and the second nozzle is adapted to supply onto the substrate a flow-restriction liquid to restrict flow of the developer on the substrate, and that the second nozzle is spaced apart from the first nozzle and located on an outer side of the substrate with respect to the first nozzle when the first nozzle is located above a central portion of the substrate placed on the substrate holder;
    performing a pre-wet process so that the first nozzle supplies the developer onto the central portion of the substrate and the second nozzle simultaneously supplies the flow-restriction liquid onto the substrate in an amount which is larger than an amount of the developer supplied under the condition that the substrate rotates around a vertical axis; and
    after stopping the supplying of the flow-restriction liquid by the second nozzle, performing a development process so that the first nozzle supplies the developer onto the substrate under the condition that the substrate rotates around the vertical axis.

2. The developing method according to claim 1, wherein the first nozzle moves from an outer edge of the substrate to the central portion of the substrate under the condition that the substrate rotates and the first nozzle supplies the developer onto the substrate.

3. The developing method according to claim 2, wherein the flow-restriction liquid is water.

4. The developing method according to claim 1, wherein the flow-restriction liquid is water.

* * * * *